US012266500B2

(12) United States Patent
Sasaki

(10) Patent No.: US 12,266,500 B2
(45) Date of Patent: Apr. 1, 2025

(54) CHARGED PARTICLE GUN AND CHARGED PARTICLE BEAM DEVICE

(71) Applicant: Hitachi High-Tech Corporation, Tokyo (JP)

(72) Inventor: Tomoyo Sasaki, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 456 days.

(21) Appl. No.: 17/773,897

(22) PCT Filed: Dec. 13, 2019

(86) PCT No.: PCT/JP2019/048961
§ 371 (c)(1),
(2) Date: May 3, 2022

(87) PCT Pub. No.: WO2021/117226
PCT Pub. Date: Jun. 17, 2021

(65) Prior Publication Data
US 2022/0415602 A1    Dec. 29, 2022

(51) Int. Cl.
*H01J 37/073* (2006.01)
*H01J 37/08* (2006.01)
(Continued)

(52) U.S. Cl.
CPC ........... *H01J 37/073* (2013.01); *H01J 37/08* (2013.01); *H01J 37/265* (2013.01); *H01J 37/28* (2013.01)

(58) Field of Classification Search
CPC ........ H01J 37/073; H01J 37/08; H01J 37/265; H01J 37/28; H01J 2237/061;
(Continued)

(56) References Cited

U.S. PATENT DOCUMENTS 8,330,130 B2 * 12/2012 Winkler ................ H01J 37/304
250/503.1
8,633,451 B2 * 1/2014 Ward ....................... H01J 37/28
250/424

(Continued)

FOREIGN PATENT DOCUMENTS

JP    53-115499 A    10/1978
JP    1-227340 A     9/1989

OTHER PUBLICATIONS

International Search Report (PCT/ISA/210) issued in PCT Application No. PCT/JP2019/048961 dated Mar. 10, 2020 with English translation (four (4) pages).

(Continued)

*Primary Examiner* — David A Vanore
(74) *Attorney, Agent, or Firm* — Crowell & Moring LLP

(57) ABSTRACT

The present disclosure provides a charged particle beam device capable of simultaneously achieving protection of a charged particle source against electrical discharging inside a charged particle gun and highly accurate control of the charged particle gun, for both DC and AC components. A charged particle gun according to the present disclosure is configured such that an extraction voltage and an acceleration voltage are superposed and supplied to a charged particle beam source, a wiring between the charged particle beam source and a voltage circuit is covered with first and second enclosures, the first enclosure is configured to be connected to an extraction electrode, and the second enclosure is configured to be connected to an acceleration electrode and to a reference voltage of the voltage circuit.

15 Claims, 7 Drawing Sheets

(51) Int. Cl.
*H01J 37/26* (2006.01)
*H01J 37/28* (2006.01)

(58) Field of Classification Search
CPC ..... H01J 2237/06341; H01J 2237/0802; H01J 3/021; H01J 37/065; H01J 37/07; H01J 3/026; H01J 37/06; H01J 1/15
See application file for complete search history.

(56) References Cited

U.S. PATENT DOCUMENTS

| | | | | |
|---|---|---|---|---|
| 9,496,673 | B2* | 11/2016 | Morishita | H01J 37/08 |
| 9,570,268 | B2* | 2/2017 | Imai | H01J 37/08 |
| 10,699,869 | B2* | 6/2020 | Preikszas | H01J 37/06 |
| 2003/0082981 | A1* | 5/2003 | Takegami | H01J 9/027 445/6 |
| 2005/0079694 | A1* | 4/2005 | Koezuka | H01J 37/3171 257/E21.334 |
| 2007/0018101 | A1* | 1/2007 | Nakasuji | B82Y 40/00 250/310 |
| 2010/0181480 | A1* | 7/2010 | Shimakura | H01J 37/20 250/311 |
| 2014/0000104 | A1* | 1/2014 | Morishita | H01J 37/065 29/825 |
| 2016/0104597 | A1* | 4/2016 | Imai | H01J 37/063 313/360.1 |
| 2017/0330739 | A1* | 11/2017 | Hosaka | H01J 49/4205 |
| 2019/0318905 | A1* | 10/2019 | Preikszas | H01J 37/22 |
| 2019/0355551 | A1* | 11/2019 | Pavia | H01J 27/22 |
| 2022/0415602 | A1* | 12/2022 | Sasaki | H01J 37/065 |
| 2023/0207257 | A1* | 6/2023 | Katsap | H01J 37/28 250/307 |
| 2023/0353056 | A1* | 11/2023 | Sasaki | H01J 37/248 |

OTHER PUBLICATIONS

Japanese-language Written Opinion (PCT/ISA/237) issued in PCT Application No. PCT/JP2019/048961 dated Mar. 10, 2020 (four (4) pages).

* cited by examiner

CHARGED PARTICLE GUN AND CHARGED PARTICLE BEAM DEVICE

TECHNICAL FIELD

The present disclosure relates to a charged particle gun that irradiates a sample with a charged particle beam.

BACKGROUND ART

Types of a charged particle beam device include (a) a scanning electron microscope (SEM) that performs magnified observation of a sample by scanning a surface of the sample with an electron beam and detecting generated signal electrons to form an image, (b) a scanning ion microscope (SIM) that performs magnified observation of a sample by scanning with an ion beam, (c) a device for processing and observing a focused ion beam (FIB) that performs processing and magnified observation of a sample by using an ion beam, (d) a transmission electron microscope (TEM) that performs magnified observation by imaging electrons transmitted through a thin film-like sample, (e) a scanning transmission electron microscope (STEM), or the like.

The charged particle beam device includes a charged particle gun that generates and accelerates a charged particle beam. Inside of a chamber of the charged particle gun is evacuated. The charged particle gun includes a charged particle source, an extraction electrode, and an acceleration electrode. The charged particle beam is generated and accelerated by applying a DC high voltage of several kV between the charged particle source and the extraction electrode and applying a DC high voltage of several kV to several hundreds of kV between the extraction electrode and the acceleration electrode. The DC high voltage applied to the charged particle source corresponds to beam energy of the charged particle beam, and is one of main factors that determine performance of the charged particle beam device such as image resolution, focal depth, and sample processing speed.

Electrical discharging of a DC high voltage inside the charged particle gun generates a transient strong electric field around the charged particle source, which may damage the charged particle source. Specifically, there are cases where a tip shape of the charged particle source is deformed and the device performance such as image resolution is deteriorated, or a tip of the charged particle source is melted and cannot generate a charged particle beam. The higher the DC high voltage to be electrically discharged, the stronger the transient electric field due to the electrical discharging, and thus the higher a damage level of the charged particle source. Therefore, in order to stably operate a charged particle beam device using a high voltage of several tens of kV to several hundreds of kV, prevention of electrical discharging and protection of the charged particle source against electrical discharging are important problems.

PTL 1 discloses an invention that protects a charged particle source (referred to as an emitter in PTL 1) against electrical discharging inside a charged particle gun. Specifically, when electrical discharging occurs between an extraction electrode and an acceleration electrode, by covering a part having a voltage of the charged particle source with a part having a voltage of the extraction electrode, a transient electric field is prevented from being generated between the charged particle source and the extraction electrode.

CITATION LIST

Patent Literature

PTL 1: JP-A-H01-227340

SUMMARY OF INVENTION

Technical Problem

PTL 1 discloses two examples. In FIG. 1 of PTL 1, by covering the part having the voltage of the charged particle source with the part having the voltage of the extraction electrode from the charged particle gun to a high voltage wiring, a stray capacitance of the charged particle source to the ground is reduced and a transient electric field during electrical discharging is restrained. However, in a circuit configuration of FIG. 1, since an overvoltage generated by an electrical discharging current between the extraction electrode and the acceleration electrode flowing via an extraction voltage source is applied between the charged particle source and the extraction electrode, a protection effect is reduced.

In FIG. 2 of PTL 1, a voltage applied to the charged particle source is generated by superimposing the extraction voltage source on an output of an acceleration voltage source between the extraction electrode and the acceleration electrode. In this circuit configuration, since when electrical discharging occurs between the extraction electrode and the acceleration electrode, the electrical discharging current does not flow via the extraction voltage source, the above problems are solved. Further, in FIG. 2, the charged particle source, the extraction electrode, wirings thereof, and the extraction voltage source are covered by a conductor enclosure, a stray capacitance between inside of the enclosure and the ground is reduced, and the electrical discharging current flows via an outer surface of the enclosure, and therefore, a stronger shield action works as a Faraday cage inside the enclosure.

From the viewpoint of protecting the charged particle source against electrical discharging inside the charged particle gun, the configuration in FIG. 2 of PTL 1 is desirable. However, in this configuration, the following problems occur due to specific electric circuits and mounting factors.

(1) Reduction in Protection Effect Due to Parasitic Inductance of Wiring

An overvoltage caused by a parasitic inductance and the electrical discharging current of a wiring between the charged particle gun and a DC high voltage source is applied between the charged particle source and the extraction electrode. Accordingly, an electric field is generated around the charged particle source, and the protection effect of the charged particle source is reduced.

(2) Deterioration of DC Accuracy Due to Load Current

DC accuracy of a high voltage output is deteriorated due to a load current flowing from the DC high voltage source to the charged particle gun, and a voltage drop due to an output resistor of the DC high voltage source. In particular, the load current varies greatly between devices depending on performance of the charged particle gun. When the DC accuracy of the high voltage output is lowered, control accuracy of beam energy is deteriorated, the device performance related to the beam energy is deteriorated, and a machine difference between devices occurs.

(3) Deterioration of AC Accuracy Due to Enclosure Superimposing Noise

The entire enclosure having a voltage of the extraction electrode is an electrostatic antenna and receives environmental disturbance noise. This noise is an AC component of the DC high voltage between the extraction electrode and the acceleration electrode, and is equivalent to an increase in energy dispersion of a beam. As a result, chromatic aberration of the charged particle beam is increased and a focus fluctuates, and device performance such as image resolution is deteriorated.

The disclosure has been devised in light of these problems, and provides a charged particle beam device capable of simultaneously achieving protection of a charged particle source against electrical discharging inside a charged particle gun and highly accurate control of the charged particle gun, for both DC and AC components.

Solution to Problem

A charged particle gun according to the disclosure is configured such that an extraction voltage and an acceleration voltage are superposed and supplied to a charged particle beam source, a wiring between the charged particle beam source and a voltage circuit is covered with first and second enclosures, the first enclosure is configured to be connected to an extraction electrode, and the second enclosure is configured to be connected to an acceleration electrode and to a reference voltage of the voltage circuit.

Advantageous Effect

With the charged particle gun according to the disclosure, a charged particle source can be protected by an action of a Faraday cage against electrical discharging inside the charged particle gun, deterioration of control accuracy due to a load current and noise can be prevented, and the charged particle gun can be controlled with high accuracy.

DESCRIPTION OF EMBODIMENTS

Figure 1:
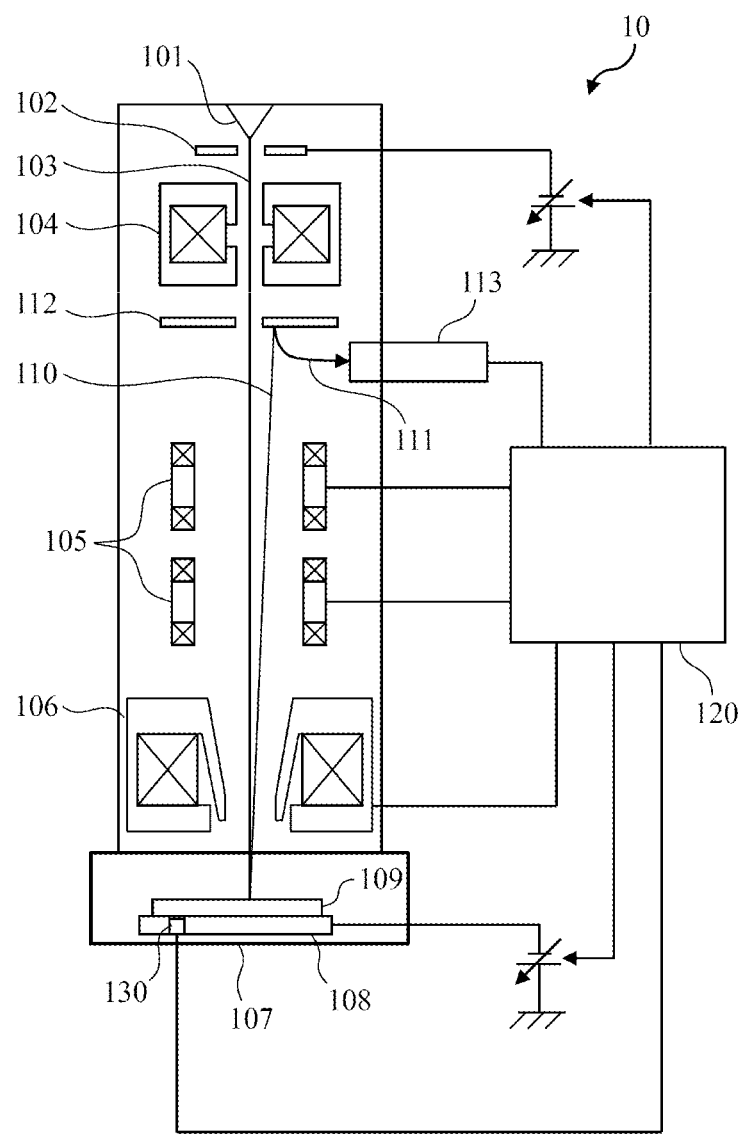
FIG. 1 is a configuration diagram of a scanning electron microscope 10 according to a first embodiment.

A charged particle beam device using a charged particle beam such as an electron beam or an ion beam is used for observation, length measurement, analysis, processing, and the like of a microstructure in various fields. For example, in a semiconductor device manufacturing line, a scanning electron microscope is used for defect observation, analysis, and length measurement of a pattern dimension. In the following embodiments, the scanning electron microscope used in the semiconductor device manufacturing line is described as an example of a charged particle beam device according to the present embodiment, but the present embodiment can also be applied to other charged particle beam devices described above.

So far, resolution and length measurement accuracy of a scanning electron microscope have been improved along with miniaturization of a pattern dimension of a semiconductor device. In recent years, stacking of devices centering on a memory device has progressed, and the scanning electron microscope is required to have three-dimensional observation and length measurement capabilities such as shape observation and length measurement of a deep hole or a deep trench, and overlay length measurement of stacked layers. Further, in recent years, cost performance of a semiconductor manufacturing and evaluation device has become more and more important, and improvements in throughput and operating rate are required.

In order to meet the above demands for device performance, there are requirements such as (1) high accuracy, (2) high acceleration, (3) large current, and (4) electron source protection for an electron gun included in the scanning electron microscope. These requirements are related to each other and it is difficult to meet all the requirements by the related art.

(1) High Accuracy

High resolution is required for a scanning electron microscope along with pattern miniaturization of a semiconductor device. Energy dispersion is one of factors influencing the resolution, and deterioration of AC accuracy of a DC high voltage applied to an electron source is equivalent to an increase in energy dispersion. As a result, problems including an increase in chromatic aberration, deterioration of resolution due to focus fluctuation, and beam sway occur. Therefore, the AC accuracy of the DC high voltage is important.

A reduction in machine difference is required for a length-measuring scanning electron microscope for a semiconductor device manufacturing line. When a length of the same sample is measured across a plurality of devices in the manufacturing line, it is required to show the same length measurement value. One of factors causing a length measurement machine difference is energy of an electron beam. Since the energy of the electron beam corresponds to a DC high voltage value applied to the electron source, the DC accuracy thereof is important.

(2) High Acceleration

In order to improve the three-dimensional observation and length measurement capabilities of the scanning electron microscope, it is effective to increase acceleration of the electron beam, that is, to increase beam energy. Accordingly, the DC high voltage value applied to the electron gun is increased, but when AC accuracy of a voltage source is deteriorated (an increase in ripples) accordingly, damage to the electron source during electrical discharging may be increased.

(3) Large Current

Regarding an improvement in throughput of the scanning electron microscope, an imaging time can be shortened by increasing a current value of the electron beam. When the current value of the electron beam is increased, a reflected electron amount inside the electron gun is increased, and an electric charge amount of an insulating insulator is also increased. This increases an electrical discharging probability. Although the configuration in FIG. 2 of PTL 1 is effective for electron source protection, the DC accuracy may be deteriorated due to the large current.

(4) Electron Source Protection

In order to improve an operation rate of the scanning electron microscope, it is required to prevent electrical discharging inside the electron gun or to protect the electron source during electrical discharging. Ideally, when a device does not cause any electrical discharging inside the electron gun or does not damage/influence the electron source even when electrical discharging occurs, it is not necessary to stop the device and the operation rate thereof can be improved. The configuration in FIG. 2 of PTL 11 is effective for the electron source protection, but as described above, there are problems such as (1) reduction in protection effect due to a parasitic inductance of a wiring, (2) deterioration of DC accuracy due to a load current, and (3) deterioration of AC accuracy due to enclosure superimposing noise.

The embodiments described below describe a scanning electron microscope for the purpose of satisfying all the above four requirements for an electron gun, and a method for controlling the electron gun.

First Embodiment

FIG. 1 is a configuration diagram of a scanning electron microscope 10 according to the first embodiment of the disclosure. An electron beam 103 is extracted from an electron source 202 by an extraction electrode 102 and accelerated by an acceleration electrode (not shown). The electron beam 103 is focused by a condenser lens 104 (in a form of a focusing lens) and then scans a sample 109 one-dimensionally or two-dimensionally by a scanning deflector 105. The electron beam 103 is decelerated by a negative voltage applied to an electrode built in a sample stage 108, is focused by a lens action of an objective lens 106, and is emitted onto the sample 109 in a vacuum sample chamber 107.

When the sample 109 is irradiated with the electron beam 103, an electron 110 such as a secondary electron and a backscattered electron is emitted from the irradiated part. The electron 110 is accelerated at an electron source direction by an acceleration action based on a negative voltage applied to the sample, collides with a conversion electrode 112, and generates a secondary electron 111. The secondary electron 111 emitted from the conversion electrode 112 is captured by a detector 113, and an output of the detector 113 changes depending on an amount of the captured secondary electrons. A brightness of a display device (not shown) changes according to the output. For example, when a two-dimensional image is formed, an image of a scanning region is formed by synchronizing a deflection signal to the scanning deflector 105 with the output of the detector 113. The scanning deflector 105 may be supplied with a signal obtained by superimposing a deflection signal for moving a field of view on a deflection signal for two-dimensionally scanning the field of view.

Deflection due to the deflection signals is also referred to as image shift deflection, and enables a movement of a field of view position of the electron microscope without moving the sample by the sample stage. In the present embodiment, an example in which the image shift deflection and scanning deflection are performed by a common deflector is shown, but an image shift deflector and a scanning deflector may be separately provided.

A control device 120 has (a) a function of controlling each component of the scanning electron microscope 10, (b) a function of forming an image based on detected electrons, and (c) a function of measuring a pattern width of a pattern formed on a sample based on an intensity distribution of the detection electrons, which is referred to as a line to profile. The control device 120 further controls a voltage to be applied to the sample 109 or the sample stage 108 based on a monitoring result of a pressure gauge 130 provided on an electrostatic chuck, and controls the scanning electron microscope 10 to perform or interrupt a measurement. A calculation device that evaluates an image generated based on a detection signal is built in the control device 120, and the calculation device executes calculation processing. The calculation processing may be performed by using a calculation device different from the calculation device provided in the scanning electron microscope 10.

Figure 2:
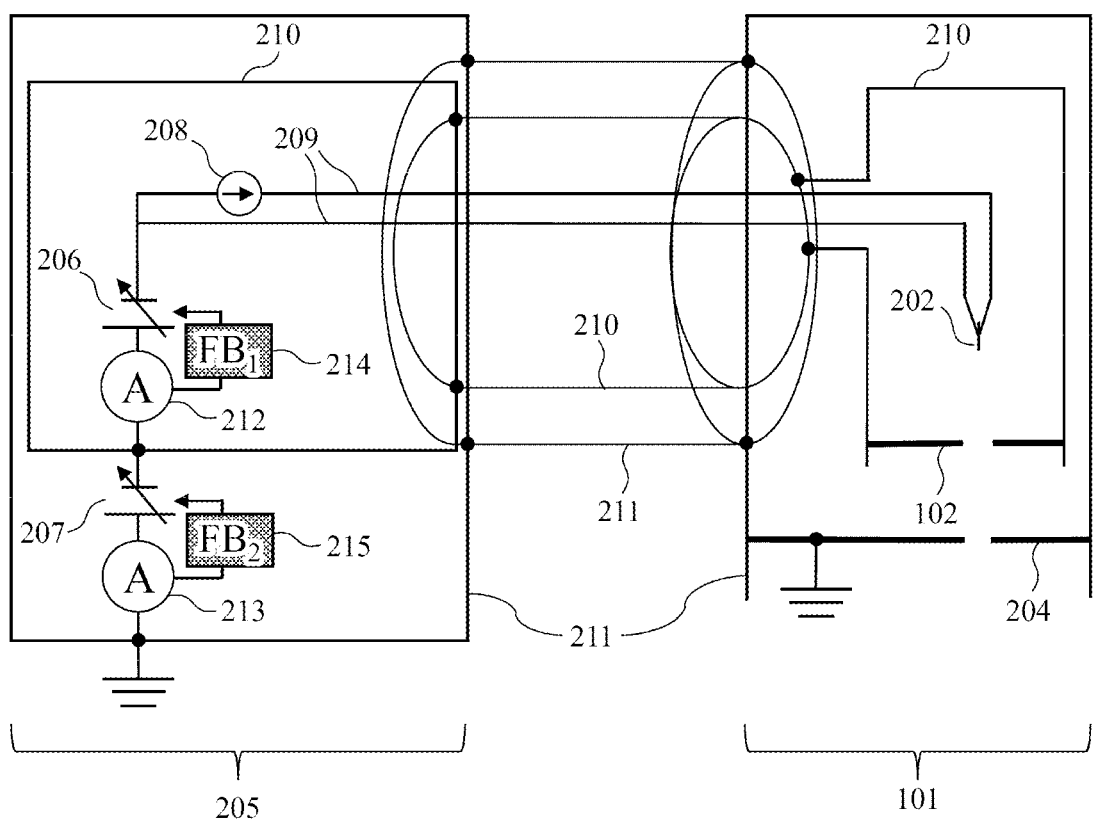
FIG. 2 is a circuit configuration diagram of an electron gun 101 and a DC high voltage source 205.

FIG. 2 is a circuit configuration diagram of an electron gun 101 and a DC high voltage source 205. The electron gun 101 includes the electron source 202 (emitter), the extraction electrode 102, and an acceleration electrode 204. The DC high voltage source 205 is a voltage circuit that supplies a voltage to the electron gun 101. The DC high voltage source 205 includes a first voltage source 206, a second voltage source 207, a current source 208, a first ammeter 212, a second ammeter 213, a first feedback control circuit 214, and a second feedback control circuit 215.

The first voltage source 206 and the second voltage source 207 are disposed (series connection in FIG. 2) such that an output voltage from the first voltage source 206 is added to an output voltage from the second voltage source 207, and the addition voltage is output to a wiring 209. The current source 208 is connected in series to an output terminal of the first voltage source 206, and outputs to the wiring 209 a current for cleaning the electron source 202.

The wiring 209 connects an output of the first voltage source 206 and an output of the current source 208 to the electron source 202. A first enclosure 210 connects an output of the second voltage source 207 and the extraction electrode 102. The first enclosure 210 covers the first voltage source 206/first ammeter 212/first feedback control circuit 214/current source 208/wiring 209/electron source 202. A second enclosure 211 is connected to the acceleration electrode 204 and a reference voltage (a ground voltage in FIG. 2) of the DC high voltage source 205. The second enclosure 211 covers the second voltage source 207/second ammeter 213/second feedback control circuit 215/first enclosure 210.

The first ammeter 212 measures a current (I1 described later) fed back from the electron gun 101 (extraction electrode 102) via the first enclosure 210. The first feedback control circuit 214 controls an output voltage of the first voltage source 206 according to the value measured by the first ammeter 212. The second ammeter 213 measures a current (I2 described later) fed back from the electron gun 101 (acceleration electrode 204) via the second enclosure 211. The second feedback control circuit 215 controls an output voltage of the second voltage source 207 according to the value measured by the second ammeter 213.

Figure 3:
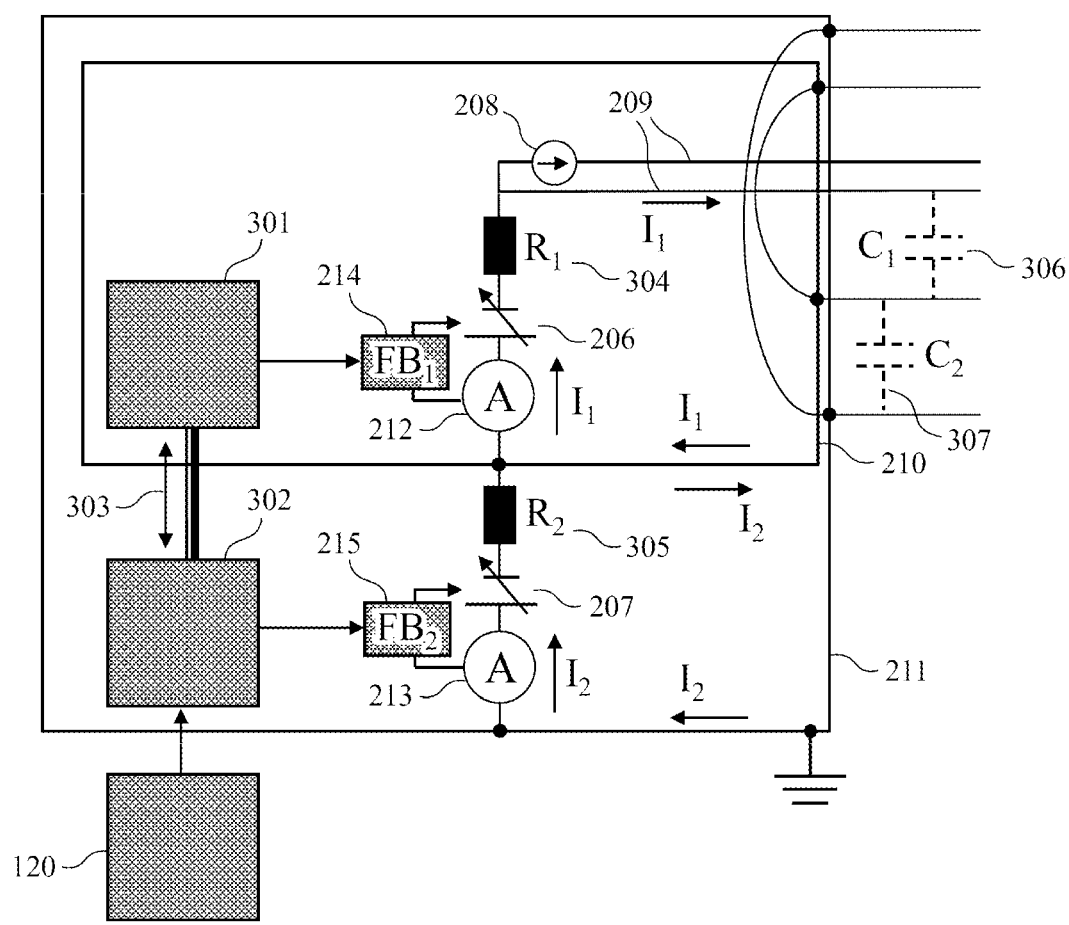
FIG. 3 is a diagram showing a detailed configuration of the DC high voltage source 205.

FIG. 3 is a diagram showing a detailed configuration of the DC high voltage source 205. The DC high voltage source 205 includes a first control circuit 301. The first control circuit 301 instructs an output voltage to the first voltage source 206 via the first feedback control circuit 214. The first control circuit 301 is housed in the first enclosure 210. The DC high voltage source 205 further includes a second control circuit 302. The second control circuit 302 instructs an output voltage to the second voltage source 207 via the second feedback control circuit 215. The second control circuit 302 is housed in the second enclosure 211. The first control circuit 301 and the second control circuit 302 are connected to each other via an optical communication fiber 303.

An output resistor 304 is connected in series with the output terminal of the first voltage source 206. An output resistor 305 is connected between an output terminal of the second voltage source 207 and the first voltage source 206. A parasitic capacitance 306 is formed between the wiring 209 and the first enclosure 210, and a parasitic capacitance 307 is formed between the first enclosure 210 and the second enclosure 211.

Figure 4:
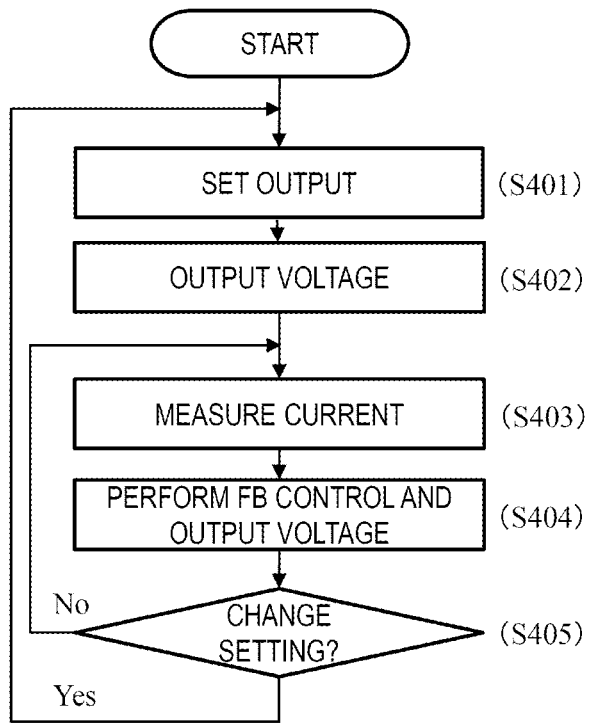
FIG. 4 is a flowchart illustrating operations of the DC high voltage source 205.

FIG. 4 is a flowchart illustrating operations of the DC high voltage source 205. Hereinafter, each step in FIG. 4 will be described.

(FIG. 4: Step S401)

The control device 120 inputs, to the second control circuit 302, set values of an acceleration voltage (V0) and an extraction voltage (V1) corresponding to energy of the electron beam 103. The second control circuit 302 instructs the set value of the extraction voltage (V1) to the first control circuit 301.

(FIG. 4: Step S402)

The second control circuit 302 calculates, according to Equation 1, a voltage value of a voltage applied between the extraction electrode 102 and the acceleration electrode 204, and instructs the second voltage source 207 to output the voltage value. The first control circuit 301 instructs the first voltage source 206 to output the extraction voltage (V1).

$$V = V0 - V1 \quad (1)$$

(FIG. 4: Step S403)

A Load current (I1 in FIG. 3) of the first voltage source 206 flows out via the wiring 209 and feeds back via the first enclosure 210. A load current (I2 in FIG. 3) of the second voltage source 207 flows out via the first enclosure 210 and feeds back via the second enclosure 211. The first ammeter 212 constantly measures the load current of the first voltage source 206, and outputs a measurement result to the first feedback control circuit 214. The second ammeter 213 constantly measures the load current of the second voltage source 207, and outputs a measurement result to the second feedback control circuit 215.

(FIG. 4: Step S404)

A voltage drop occurs due to a load current at each of the output resistor 304 (resistance value R1) and the output resistor 305 (resistance value R2). The first feedback control circuit 214 compensates for the voltage drop in the output resistor 304 according to Equation 2, and then sets Vset1 as the output voltage of the first voltage source 206. The second feedback control circuit 215 compensates for the voltage drop in the output resistor 305 according to Equation 3, and then sets Vset2 as the output voltage of the second voltage source 207. It is also possible to perform feedback control by measuring a voltage drop in an output resistor by an isolation amplifier or the like without measuring a load current.

$$Vset1 = V1 + I1 \times R1 \quad (2)$$

$$Vset2 = V0 - V1 + I2 \times R2 \quad (3)$$

(FIG. 4: Step S405)

When there is a change in output setting, the processing returns to step S401, and when there is no change, the processing returns to step S403.

In controlling the acceleration voltage (V0) corresponding to the energy of the electron beam 103, similar to the Vset1 and the Vset2, two feedback loops are separately provided inside the first enclosure 210 and inside the second enclosure 211. Accordingly, a control system does not straddle the enclosures, so that a Faraday cage action during electrical discharging is stronger. Even when feedback control is performed for temperature fluctuations as in the related art without feedback control for a load current, the Faraday cage action is strengthened by performing a similar two-stage feedback control for each enclosure.

The second enclosure 211 having a ground voltage acts as a shield against environmental disturbance noise by covering the first enclosure 210, which is an antenna against noise. The output resistor 304 acts as a low-pass filter together with the parasitic capacitance 306 between the wiring 209 and the first enclosure 210, and can reduce an AC component of the first voltage source 206, The output resistor 305 acts as a low-pass filter together with the parasitic capacitance 307 between the first enclosure 210 and the second enclosure 211, and can reduce an AC component of the second voltage source 207.

Figure 5:
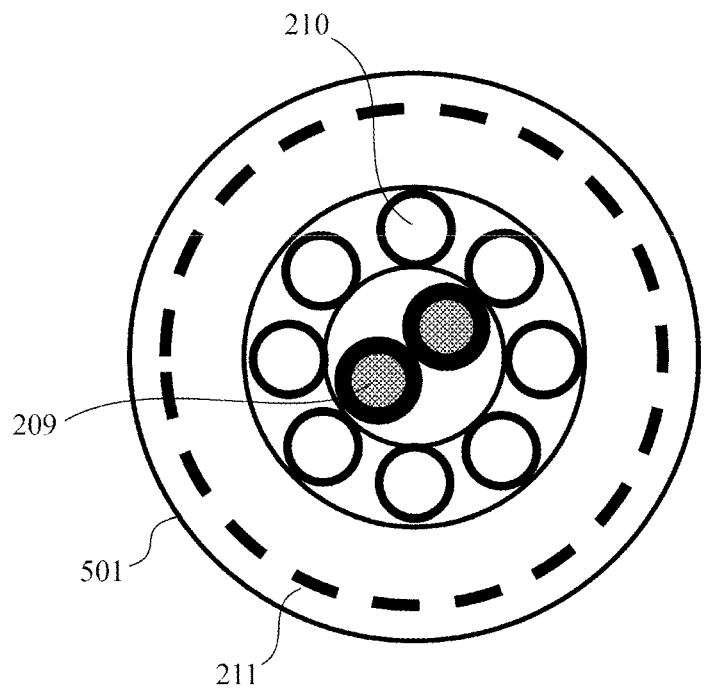
FIG. 5 shows a cross-sectional example of a connection wiring in which a first enclosure 210 branches into eight wirings and a second enclosure 211 is formed in a mesh form.

FIG. 5 shows a cross-sectional example of a connection wiring in which the first enclosure 210 branches into eight wirings and the second enclosure 211 is formed in a mesh form. The first enclosure 210 and the second enclosure 211 are intended to be electrical enclosures, and thus do not need to be completely enclosed as geometric shapes. Any voltage distribution may be used if a voltage distribution of the second enclosure 211 covers a voltage distribution of the first enclosure 210, and the voltage distribution of the first enclosure 210 covers the first voltage source 206, the current source 208, and the wiring 209. For example, in a connection wiring between the electron gun 101 and the DC high voltage source 205, an enclosure may be distributed in a mesh form or may be distributed so as to be branched into a plurality of wirings and surrounded by the plurality of wirings. An example thereof is shown in FIG. 5. The second enclosure 211 may be further covered by an insulating coating 501.

Electrical discharging inside the electron gun 101 mainly occurs between the extraction electrode 102 and the acceleration electrode 204 to which the highest voltage is applied. In a configuration of the electron gun 101 in the related art, since an electrical discharging current feeds back, for example, via the ground, a parasitic inductance in an electrical discharging current path is increased, and there arises a problem that an overvoltage is applied between the electron source 202 and the extraction electrode 102 (problem (1) described above). In contrast, in the present embodiment, since the first enclosure 210 is inside the second enclosure 211, an electrical discharging current feeds back via a path that is easier to flow. That is, the electrical discharging current flows out via the first enclosure 210 and feeds back via the second enclosure 211. Accordingly, the parasitic inductance of the electrical discharging current path can be reduced as compared with one in the related art, so that the problem of overvoltage can be solved.

At the moment of electrical discharging, an electric charge accumulated in the parasitic capacitance 307 is firstly discharged through the parasitic inductance. An overvoltage generated between the electron source 202 and the extraction electrode 102 at this time is a voltage obtained by dividing an overvoltage generated in the parasitic inductance by a capacitance between the output resistor 304 and the electron source 202 and the extraction electrode 102. Thus, the overvoltage due to electrical discharging can be reduced by increasing the output resistor 304.

After the electric charge of the parasitic capacitance 307 is discharged, a current proportional to a voltage value in Equation 1 and inversely proportional to a resistance value (R2) of the output resistor 305 of the second voltage source 207 flows through the parasitic inductance to generate an overvoltage. Thus, the overvoltage due to electrical discharging can be reduced by increasing the output resistor 305.

Therefore, a cutoff frequency of a low-pass filter can be also lowered to further reduce an AC component by increasing the output resistor 304 and the output resistor 305. However, the voltage drops in the output resistors 304 and 305 due to the load currents (I1 and I2) may be increased, and the DC accuracy may be deteriorated.

Figure 6:
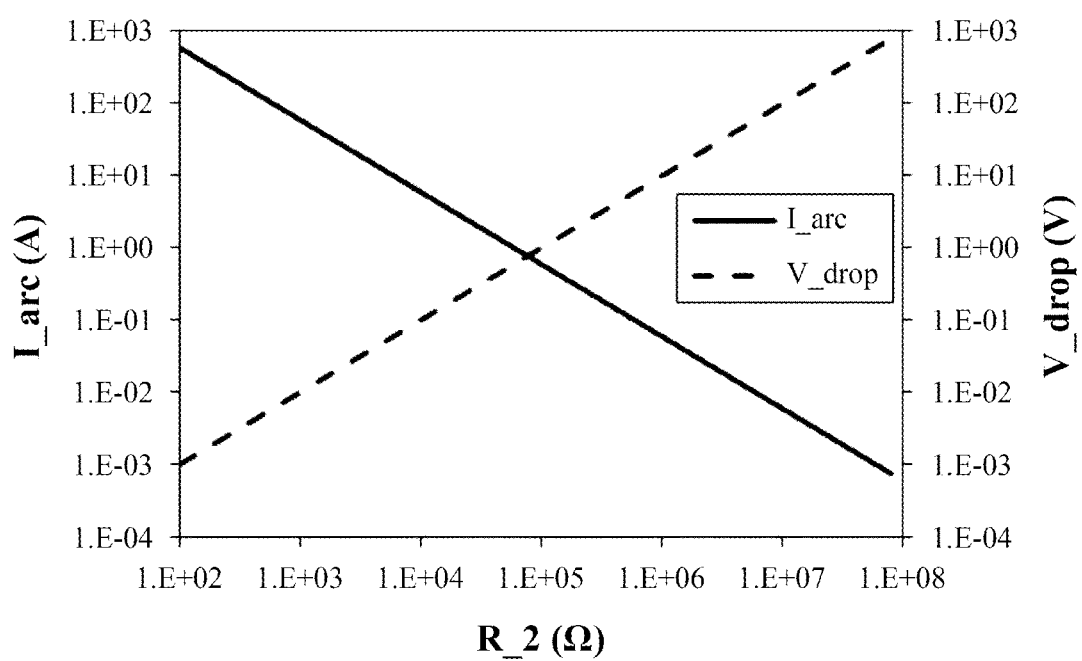
FIG. 6 shows a relationship between a voltage drop (Vdrop) and an electrical discharging current (Iarc) at an output resistor 305.

FIG. 6 shows a relationship between a voltage drop (Vdrop) and an electrical discharging current (Iarc) at the output resistor 305. In FIG. 6, an example in a case of V=60 kV and I2=0.01 mA in Equation 1 is shown. It can be seen that when the output resistor 305 (R2) is increased, the electrical discharging current (Iarc) can be reduced, but the voltage drop (Vdrop) is increased. Since the influence of the voltage drop on the electron source 202 can be restrained by feedback-controlling each voltage source after compensating for the voltage drop, the accuracy of a DC voltage can be ensured while the overvoltage and the AC component are restrained.

First Embodiment: Conclusion

The scanning electron microscope 10 according to the first embodiment is configured to output to the wiling 209 an addition voltage obtained by adding the output voltage of the first voltage source 206 to the output voltage of the second voltage source 207, the first enclosure 210 is connected to the extraction electrode 102, and the second enclosure 211 is connected to the ground voltage and the acceleration electrode 204. Accordingly, it is possible to avoid fully applying a high voltage between both electrodes to the electron source 202 due to electrical discharging generated between the extraction electrode 102 and the acceleration electrode 204. This is because a voltage of each electrode is stable. Therefore, damage to the electron source 202 due to the electrical discharging can be restrained.

In the scanning electron microscope 10 according to the first embodiment, the first enclosure 210 covers the wiring 209, and the second enclosure 211 covers the first enclosure 210. Accordingly, the electron source 202 can be protected by an action of the Faraday cage against the electrical discharging inside the electron gun 101.

In the scanning electron microscope 10 according to the first embodiment, by disposing the first enclosure 210 inside the second enclosure 211, an electrical discharging current between the extraction electrode 102 and the acceleration electrode 204 flows out via the first enclosure 210 and feeds back via the second enclosure 211. Accordingly, the parasitic inductance of the electrical discharging current path can be restrained. Therefore, it is possible to avoid applying, between the electron source 202 and the extraction electrode 102, an overvoltage generated by an electrical discharging current flowing via the extraction voltage source (the first voltage source 206).

In the scanning electron microscope 10 according to the first embodiment, the first feedback control circuit 214 controls the first voltage source 206 according to the current feeding back from the first enclosure 210, and the second feedback control circuit 215 controls the second voltage source 207 according to the current feeding back from the second enclosure 211. That is, each feedback control circuit controls a voltage source by using feedback currents that are independent of each other. Accordingly, control accuracy of a DC voltage component can be improved while a Faraday cage action of a double enclosure is maintained.

In the scanning electron microscope 10 according to the first embodiment, by increasing the output resistor 305 while performing feedback control on the voltage drop (I2×R2) due to the load current (I2), it is possible to improve the AC accuracy and the DC accuracy while reducing the overvoltage due to the electrical discharging. Similarly, by increasing the output resistor 304 while performing feedback control on the voltage drop (I1×R1) due to the load current (I1), it is possible to improve the AC accuracy and the DC accuracy while reducing the overvoltage between the electron source 202 and the extraction electrode 102 due to the electrical discharging by a voltage dividing action of the output resistor 304 and the capacitance.

With the scanning electron microscope 10 according to the first embodiment, it is possible to realize all of the high accuracy, the high acceleration, the large current, and the electron source protection of the electron gun 101 by solving the problems of an electron gun in the related art by the above configuration.

Second Embodiment

In FIG. 2, a cold field emission electron gun has been described as an example, but the disclosure can also be applied to other electron guns or ion guns such as thermal electron guns and Schottky electron guns. In the second embodiment of the disclosure, a specific example thereof will be described.

Figure 7A:
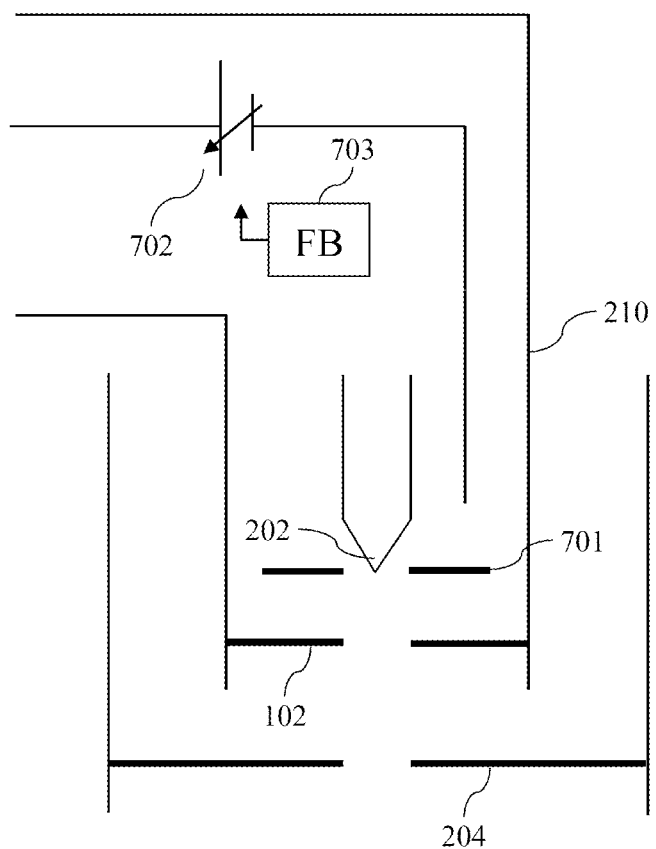
FIG. 7A shows a configuration example in which the electron gun 101 includes a suppressor electrode 701.

FIG. 7A shows a configuration example in which the electron gun 101 includes a suppressor electrode 701. The suppressor electrode 701 outputs a negative voltage to the electron source 202, which has an effect of restraining thermal electrons generated from the electron source 202. A voltage source 702 supplies the voltage to the suppressor electrode 701, A feedback circuit 703 feedback-controls the voltage source 702 according to an output current from the voltage source 702. The suppressor electrode 701/voltage source 702/feedback circuit 703 can be housed inside the first enclosure 210.

Figure 7B:
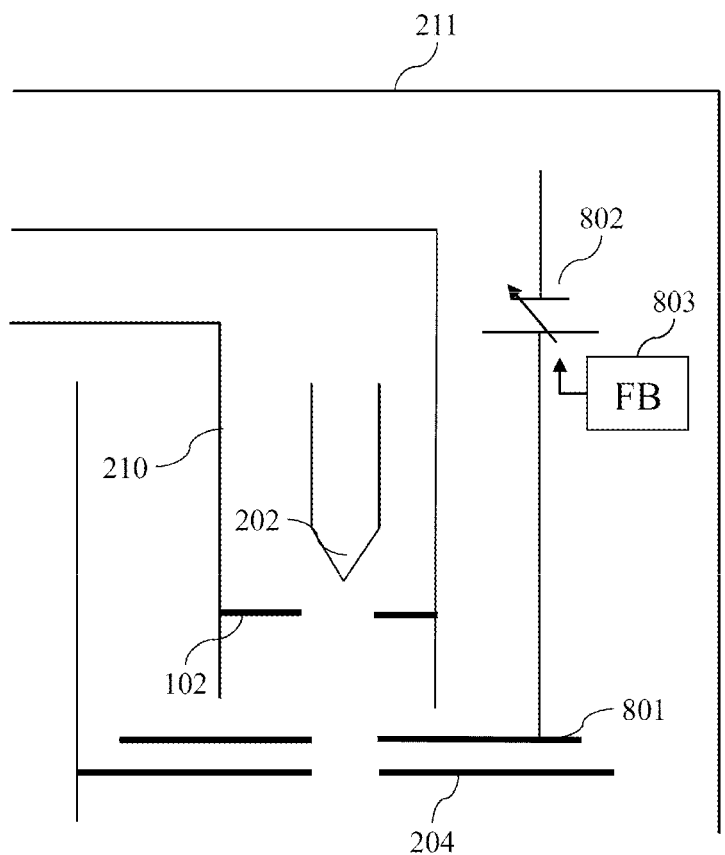
FIG. 7B shows a configuration example in which the electron gun 101 includes a lens electrode 801.

FIG. 7B shows a configuration example in which the electron gun 101 includes a lens electrode 801. The lens electrode 801 focuses an electron beam emitted by the electron source 202. A voltage source 802 supplies a voltage to the lens electrode 801. A feedback circuit 803 feedback-controls the voltage source 802 according to an output current from the voltage source 802. The lens electrode 801/voltage source 802/feedback circuit 803 can be housed outside the first enclosure 210 and inside the second enclosure 211.

Modification of Disclosure

The disclosure is not limited to the above embodiments, and includes various modifications. For example, the above embodiments have been described in detail for easy understanding of the disclosure, and are not necessarily limited to those including all the configurations described above. Further, a part of the configurations in one embodiment can be replaced with a configuration in another configuration. Furthermore, the configuration in another embodiment also can be added to the configurations in one embodiment. In addition, a part of the configuration in another configuration can be added to, eliminated from, or replaced with a part of the configurations in each embodiment.

In the above embodiments, the first feedback control circuit 214 and the second feedback control circuit 215 can calculate the voltage drop at each of the output resistors 304 and 305 according to the measurement results of the ammeters. Alternatively, the voltage drops may be measured by other methods. Each feedback control circuit can be formed by an analog circuit using an operational amplifier, a digital circuit using a digital signal processor (DSP), or the like.

In the above embodiments, an example in which electrons emitted from a sample are once converted by a conversion electrode to be detected has been described, but the disclosure is not limited to such configurations and it is possible to adopt a configuration in which an electron multiplier tube or a detection surface of a detector is disposed on a trajectory of accelerated electrons, for example.

REFERENCE SIGNS LIST

- 10 scanning electron microscope
- 101 electron gun
- 102 extraction electrode
- 103 electron beam
- 104 condenser lens
- 105 scanning deflector
- 106 objective lens
- 107 vacuum sample chamber
- 108 sample stage
- 109 sample
- 110 electron
- 111 secondary electron
- 112 conversion electrode
- 113 detector
- 120 control device
- 130 pressure gauge
- 202 electron source
- 204 acceleration electrode
- 205 DC high voltage source
- 206 first voltage source
- 207 second voltage source
- 208 current source
- 209 wiring
- 210 first enclosure
- 211 second enclosure
- 212 first ammeter
- 213 second ammeter
- 214 first feedback control circuit
- 215 second feedback control circuit
- 301 first control circuit
- 302 second control circuit
- 303 optical communication fiber
- 304 output resistor
- 305 output resistor
- 306 parasitic capacitance
- 307 parasitic capacitance
- 501 insulating coating

The invention claimed is:

1. A charged particle gun configured to irradiate a sample with a charged particle beam, the charged particle gun comprising:
    a charged particle beam source configured to emit the charged particle beam;
    a voltage circuit configured to supply a voltage to the charged particle beam source;
    a wiring configured to connect the charged particle beam source and the voltage circuit;
    a cover portion configured to cover the wiring;
    an extraction electrode configured to extract the charged particle beam from the charged particle beam source; and
    an acceleration electrode configured to accelerate the charged particle beam, wherein
    the voltage circuit includes a first voltage source and a second voltage source,
    the first voltage source and the second voltage source are disposed to output to the wiring an addition voltage obtained by adding an output voltage from the first voltage source to an output voltage from the second voltage source,
    the cover portion includes a first enclosure and a second enclosure,
    the first enclosure is configured to be connected to the extraction electrode and to an output terminal of the second voltage source, and
    the second enclosure is configured to be connected to the acceleration electrode and to a reference voltage of the voltage circuit.

2. The charged particle gun according to claim 1, wherein the voltage circuit includes a first feedback control circuit configured to feedback-control the first voltage source according to a current fed back from the extraction electrode to the first voltage source via the first enclosure, and
    the first feedback control circuit is housed in the first enclosure.

3. The charged particle gun according to claim 1, wherein the voltage circuit includes a second feedback control circuit configured to feedback-control the second voltage source according to a current fed back from the acceleration electrode to the second voltage source via the second enclosure, and
    the second feedback control circuit is housed in the second enclosure.

4. The charged particle gun according to claim 1, wherein the first enclosure is configured such that a voltage distribution of the first enclosure covers the wiring and the first voltage source.

5. The charged particle gun according to claim 1, wherein the second enclosure is configured such that a voltage distribution of the second enclosure covers the voltage distribution of the first enclosure.

6. The charged particle gun according to claim 1, wherein the voltage circuit includes a first output resistor connected between an output terminal of the first voltage source and the wiring, and
    the first voltage source outputs a current to the wiring via the first output resistor.

7. The charged particle gun according to claim 1, wherein the voltage circuit includes a second output resistor connected between the first voltage source and the second voltage source, and
    the second voltage source outputs a current to the first enclosure via the second output resistor.

8. The charged particle gun according to claim 6, wherein the first output resistor and a stray capacitance between the wiring and the first enclosure act as a low-pass filter configured to reduce an AC component of an output voltage output by the first voltage source.

9. The charged particle gun according to claim 7, wherein the second output resistor and a stray capacitance between the first enclosure and the second enclosure act as a low-pass filter configured to reduce an AC component of an output voltage output by the second voltage source.

10. The charged particle gun according to claim 2, wherein
the voltage circuit includes a first output resistor connected between an output terminal of the first voltage source and the wiring,
the first voltage source outputs a current to the wiring via the first output resistor, and
the first feedback control circuit feedback-controls the first voltage source such that the first voltage source outputs a voltage obtained by adding a voltage drop due to the first output resistor to a set value of an extraction voltage applied to the extraction electrode.

11. The charged particle gun according to claim 3, wherein
the voltage circuit includes a second output resistor connected between the first voltage source and the second voltage source,
the second voltage source outputs a current to the first enclosure via the second output resistor, and
the second feedback control circuit feedback-controls the second voltage source such that the second voltage source outputs a voltage obtained by subtracting a set value of an extraction voltage applied to the extraction electrode from a set value of an acceleration voltage applied to the charged particle beam source, and further adding a voltage drop due to the second output resistor.

12. The charged particle gun according to claim 1, further comprising:
a current source configured to clean or heat the charged particle beam source, wherein
the current source is housed in the first enclosure.

13. The charged particle gun according to claim 1, further comprising:
a suppressor electrode configured to restrain thermal electrons generated from the charged particle beam source;
a suppressor voltage source configured to supply a voltage to the suppressor electrode; and
a circuit configured to control the suppressor voltage source according to an output current from the suppressor voltage source, wherein
the suppressor voltage source is housed in the first enclosure.

14. The charged particle gun according to claim 1, further comprising:
a lens electrode constituting a lens configured to focus the charged particle beam with respect to the sample;
a lens voltage source configured to supply a voltage to the lens electrode; and
a circuit configured to control the lens voltage source according to an output current from the lens voltage source, wherein
the lens voltage source is located outside the first enclosure and inside the second enclosure.

15. A charged particle beam device comprising the charged particle gun according to claim 1.

* * * * *